Sept. 6, 1955

WEN YUAN PAN 2,717,313

TUNABLE CIRCUIT STRUCTURE

Filed May 29, 1951

INVENTOR
Wen Yuan Pan
BY
H. O. Newton
ATTORNEY

United States Patent Office 2,717,313

Patented Sept. 6, 1955

2,717,313

TUNABLE CIRCUIT STRUCTURE

Wen Yuan Pan, Collingswood, N. J., assignor to Radio Corporation of America, a corporation of Delaware Application May 29, 1951, Serial No. 228,891

2 Claims. (Cl. 250—36)

Figure 1:
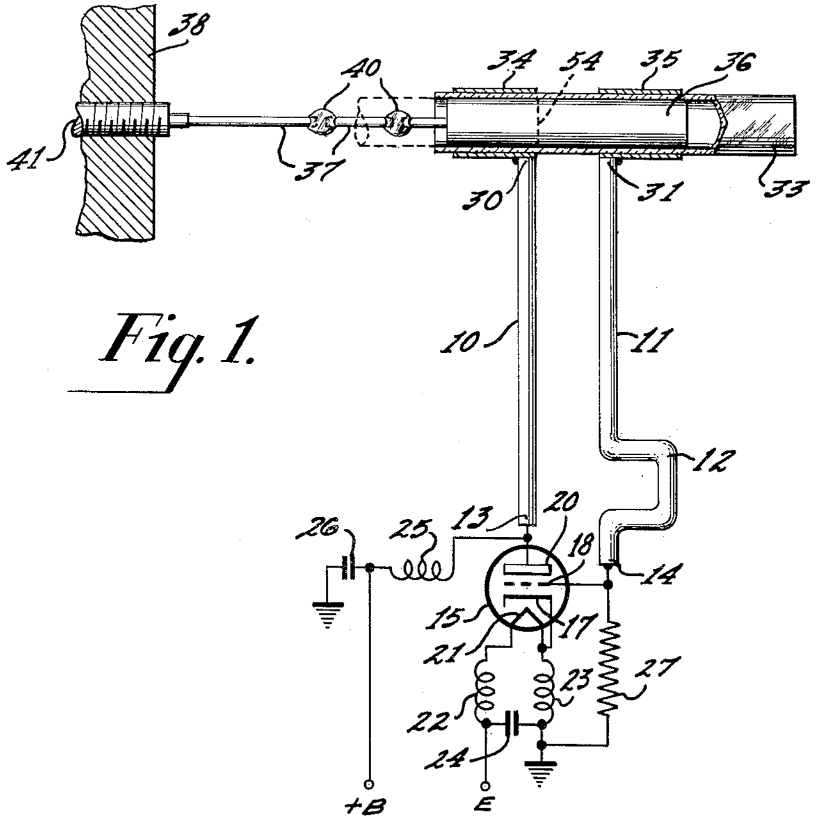

This invention relates generally to resonant circuit structures, and particularly relates to a resonant structure tunable over an appreciable portion of the ultra high frequency (U. H. F.) spectrum and suitable especially as the main frequency determining circuit element of an oscillation generator.

Recently the U. H. F. band from 500 to 890 megacycles (mc.) has tentatively been allocated for broadcasting television signals. Tunable circuit structures in accordance with the invention are particularly adapted for tuning receivers for such broadcast signals to selected television stations broadcasting within this new U. H. F. band, and also for tuning, for example, the local oscillator of a superheterodyne receiver over a similar U. H. F. range to provide a desired intermediate frequency. The higher the intermediate frequency of the receiver, the larger the tuning ratio which the local oscillator must cover. This is shown by the following table which gives the required oscillator frequency range for different intermediate frequencies as well as the ratio over which the oscillator must be tuned to receive a station within the U. H. F. range from 500 to 890 mc.

| Intermediate frequency, mc. | Oscillator Frequency Range | | | |
|---|---|---|---|---|
| | Oscillator frequency higher than signal frequency | | Oscillator frequency lower than signal frequency | |
| | Range, mc. | Ratio | Range, mc. | Ratio |
| 24 | 524.914 | 1.742 | | |
| 44 | 544.934 | 1.717 | | |
| 60 | | | 540–830 | 1.537 |
| 82 | | | 418–808 | 1.933 |
| 135 | | | 365–755 | 2.068 |
| 210 | | | 290–680 | 2.345 |

Accordingly, the local oscillator of a superheterodyne television receiver adapted to cover the new U. H. F. television band must be tunable over a range of approximately 2.3 to 1 or slightly less depending on the desired intermediate frequency.

It will be appreciated that a tunable circuit for use within the new U. H. F. television band cannot consist of lumped circuit elements because the carrier wave frequency is too high. On the other hand, the frequency of a carrier wave within this new U. H. F. frequency range is so low that resonant structures such as a resonant cavity, which are conventionally used in the upper U. H. F. band, cannot be used. Consequently, resonant circuit structures which have heretofore been suggested for use in the lower U. H. F. band may consist of resonant transmission lines or modifications thereof.

Thus, it has been proposed to utilize a resonant transmission line such as a parallel wire line which may have an open end. In that case, the line resonates to develop a standing half wave pattern. If the open end of the transmission line is short-circuited or is bridged, for example, by a capacitor, the line operates as a quarter wave line.

Such a tuned transmission line is equivalent to a series resonant circuit. It will be obvious that the tuning range of such a resonant transmission line cannot exceed a ratio of 2 to 1. In practice the tuning range will be considerably less than that, such as 1.8 to 1 or less. This is due to the fact that for half wave operation the capacitance across the ends of the line must approach zero, and for quarter wave operation infinity, in order to cover a tuning range of 2 to 1. Accordingly, a conventional tuned transmission line which is bridged by a variable capacitor cannot be made to cover the tuning range required for the local oscillator of a U. H. F. television receiver.

It is, accordingly, an object of the present invention to provide a resonant structure tunable over a frequency range of more than 2 to 1 within the U. H. F. spectrum.

Another object of the invention is to provide an oscillation generator which will develop sufficient oscillatory energy over a wide frequency range within the U. H. F. band.

A further object of the invention is to provide a resonant structure equivalent to a series resonant circuit suitable, for example, for use in the local oscillator of a television receiver adapted for receiving signals in a U. H. F. television band such as the present band of from 500 to 890 mc. for example.

A resonant circuit structure in accordance with the present invention comprises a pair of parallel conducting rods which provide a resonant or tuned two wire transmission line. One end of each of the rods may be connected to utilization means such, for example, as an amplifier tube. The free ends of the two rods are connected individually to two conductive capacitance members or metallic plates which are spaced apart and electrically insulated from each other. These may be in the form of cylindrical conductors or metallic sleeves arranged in spaced coaxial relation to each other on an insulating tube. A conductive tuning element or metallic core is movable with respect to the two capacitance members and is insulated therefrom to effectively provide a pair of capacitors between the core and each of the two members. By sliding the core axially with respect to the two members, the capacitance which bridges the transmission line may be varied and hence the tuning, that is, the resonant frequency of the line.

The core has a first extreme position where it is disposed closely adjacent to the two capacitance members to provide a maximum capacitance across the ends of the transmission line. Actually a capacitor is provided between one rod and the core, which is in series with an inductance represented by the core and a second capacitor provided between the core and the second rod. Thus, the effective length of the transmission line is extended for quarter wave operation. The core has a second extreme position wherein it is disposed closely adjacent to only one of the members. The line is then effectively open and a standing half wave pattern is developed but the effective length of the line is not extended.

One of the conducting rods may be provided with an open loop intermediate its ends to compensate for the core extending from one capacitance member. Hence the resonant structure is rendered more symmetrical for half wave operation. The transmission line described may be connected to an amplifier tube to provide an oscillation generator. It has been found that when connected in accordance with the invention, the tuning range of such oscillation generators may be extended to approximately 2.4 to 1.

Figure 2:
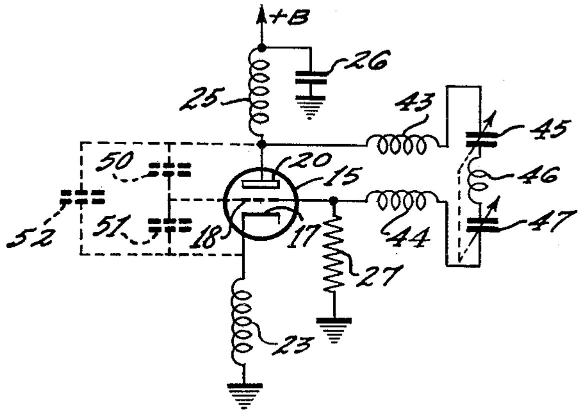

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic representation and circuit diagram of an oscillation generator embodying the present invention; and Figure 2 is an equivalent circuit diagram of the oscillator of Figure 1 illustrating its operation at the low frequency end of its tuning range.

The oscillation generator illustrated in Figure 1 comprises two rods 10 and 11 which are disposed substantially parallel to each other. The rods 10 and 11 may consist of a suitable conducting material such, for example, as brass or Kovar and are preferably silver plated. They may have a diameter of 1/16 inch and may be spaced by ½ inch for operation at U. H. F. frequencies hereinbefore referred to. Rods 10 and 11 may have a length of 1 inch. Rod 11 may be provided with a loop 12 intermediate its ends for a purpose to be explained hereinafter. The loop 12 may, for example, be of U shape as clearly shown in the drawing. The rods 10 and 11 provide a resonant or tunable parallel wire transmission line.

The lower ends or terminals 13 and 14 of the rods are connected to some utilization means such as an amplifier to provide, for example, an oscillation generator. The amplifier may consist of a vacuum tube 15 having a cathode 17, a control grid 18 and an anode 20. The lower terminals 13, 14 of the rods 10, 11 are connected respectively to the anode 20 and to the control grid 18. The cathode 17 is connected to the filament 21 which is supplied with an energizing voltage E through choke coils 22 and 23. Choke coil 23 may be grounded and provides an impedance element between the cathode 17 and ground. The two choke coils 22, 23 may be connected through a signal frequency bypass capacitor 24. The anode 20 is supplied with positive operating potential from a source +B through choke 25 and the source may be bypassed to ground through bypass capacitor 26. The grid 18 may be grounded through a grid leak resistor 27 as is conventional.

In accordance with the present invention, the transmission line formed by rods 10, 11 has its free ends or terminals 30, 31 bridged by a variable reactance. To this end, there may be provided a tube 33 of a material having a high dielectric constant such, for example, as a glass tube or a tube of ceramic material. The tube 33 is provided with two conductive capacitance members or metallic coatings 34 and 35, which may, for example, be provided by silver plating the tube 33. The far ends or terminals 30, 31 of rods 10, 11 are electrically connected with coatings 34, 35 respectively. It will be noticed that the coatings 34, 35 are spaced from each other substantially by the distance between rods 10, 11, which may be ½ inch. Each of the coatings 34, 35 may have a length of 5/16 inch and the tube 33 may have an outer diameter of ¼ inch and a wall thickness of 0.025 inch.

Further in accordance with the present invention, conductive tuning element or metallic core 36 is slideable within tube 33 and with respect to the coatings 34, 35. Core 36 may, for example, consist of brass and may have a length of 1 inch and a diameter of .200 inch to be freely movable within the tube 33. The core 36 serves the purpose of tuning the parallel wire transmission line as will be more fully explained hereinafter. Core 36 may be of cylindrical form as shown or it may have tapered ends if desired to provide for a predetermined relationship between the core movement and the resulting frequency change. The core 36 is actuated by a stiff wire 37 which may, for example, consist of Kovar and which is insulated from the chassis 38 by two or more glass beads 40 as disclosed and claimed in the copending application to T. Murakami, filed February 2, 1950, Serial No. 142,013 now Patent No. 2,601,445 issued on June 24, 1952 and assigned to the assignee of this application. Movement of the tuning core may be efffected by rotation of a screw 41 which is threaded through chassis 38.

The operation of the oscillation generator of Figure 1 will now be explained. When the tuning core 36 is in the position shown in full lines in Figure 1, the transmission line 10, 11 is electrically bridged by a reactance which consists essentially of the capacitance between coating 34 and tuning core 36, the inductance provided by tuning core 36 and a second capacitance provided between tuning core 36 and coating 35. This has been illustrated schematically in the equivalent circuit of Figure 2 to which reference is now made. The inductors 43 and 44 in the circuit of Figure 2 represent schematically the inductance of rods 10 and 11 respectively. Capacitor 45 represents the capacitance between coating 34 and core 36. Inductor 46 represents the inductance of core 36 and capacitor 47 represents the capacitance between core 36 and coating 35.

Accordingly, the transmission line 10, 11 with the tuning core in its first extreme position shown in full lines in Figure 1 is equivalent to the series resonant circuit 43—47. This series resonant circuit is connected between anode 20 and control grid 18 of amplifier 15. The capacitors 50, 51 and 52 shown in dotted lines indicate respectively the interelectrode capacitances between anode 20 and control grid 18, between control grid 18 and cathode 17 and finally between anode 20 and cathode 17. The capacitor 51 provides coupling between grid 18 and cathode 17 and the capacitor 52 provides coupling between the anode 20 and cathode 17 thereby to develop the required feedback for an oscillation generator. Choke coil 23 maintains cathode 17 at a varying potential above ground potential.

With the tuning core 36 in the position shown in Figure 1 a standing quarter wave is developed in the transmission line. The effective length of this quarter wave line is extended by the capacitors 45, 47 and by inductor 46 which bridge the far ends 30, 31 of the transmission line. The effective length of the transmission line for quarter wave operation is further extended by the tube 33 having a high dielectric constant which effectively reduces the velocity of the electromagnetic wave traveling across the far ends of the transmission line. Finally, the interelectrode capacitance 50 which is of the order of 1.5 micromicrofarads has an appreciable impedance at the lower end of the frequency range corresponding to quarter wave operation and also tends to extend the effective length of the transmission line.

In order to tune the resonant structure toward the high frequency end of the tuning range, the core 36 is moved toward the left of Figure 1 until it finally reaches the position shown at 54 in dotted lines. In that position the core extends within coating 34 only and away from the coating 35. The transmission line is now effectively open at its far ends 30, 31. Under these conditions, a standing half wave is developed in the transmission line 10, 11. In that case, the tuning core 36 has little effect on the operation of the transmission line. Furthermore, the dielectric constant of tube 33 substantially does not affect the length of the transmission line. The interelectrode capacitance 50 now has a considerably smaller impedance at the high frequency end and also substantially does not extend the effective length of the transmission line which, of course, would reduce the tuning range.

The loop 12 which is effectively a discontinuity section of the transmission line tends to strengthen the oscillation for half wave operation of the line. In other words, the transmission line becomes more symmetrical because rod 10 is coupled to the tuning core 36 which extends away from the coating 34. For half wave operation the transmission line should be as symmetrical as possible because a voltage maximum exists at the far ends 30, 31 of the transmission line. However, it has been found that the loop or discontinuity 12 of rod 11 has no effect on the operation of the line when a quarter wave standing pattern is formed, that is, when the core 36 is in the full line position of Figure 1.

Experiments with the oscillation generator of Figure 1 have shown that a tuning range of 2.4 to 1 may be obtained. It has also been found that the frequency drift of the oscillator is no more than 50 kc. (kilocycles) for an oscillatory frequency which may be between 500 and 890 mc. The warm-up frequency drift of the oscillation generator may be minimized by varying the temperature coefficient of the material of which tube 33 consists. Furthermore, rods 10 and 11 may consist of either Kovar or brass. A fixed capacitor may be connected between anode 20 and ground, and this capacitor may have a suitable temperature coefficient. Furthermore, a fixed capacitor of suitable temperature coefficient may be connected in series with the line 10, 11 to conduct heat generated by amplifier 15 rapidly to the resonant circuit structure.

There has thus been disclosed a resonant circuit structure which is tunable over a frequency range of approximately 2.4 to 1 within the U. H. F. spectrum. The circuit structure may be connected, for example, between the anode and control grid of an amplifier to provide an oscillation generator tunable within the U. H. F. band. Such an oscillator has a frequency drift which does not exceed approximately 50 kc. An oscillation generator of this type may be provided in a superheterodyne receiver or converter adapted for receiving television stations within the U. H. F. range from 500 to 890 mc.

What is claimed is:

1. A series resonant circuit structure tunable over a frequency range of over two to one within the U. H. F. spectrum and comprising a first and a second rod disposed substantially parallel to each other to form a parallel wire transmission line, said second rod including an open loop intermediate its ends, a hollow tube of a material having a high dielectric constant, a first and a second metallic coating provided on the outer surface of said tube and spaced from each other substantially by the distance between said rods, said first coating being electrically connected to one end of said first rod and said second coating being electrically connected to one end of said second rod, a metallic core slideable in said tube, and means for moving said core into a first extreme position wherein said core extends within both of said coatings to provide effectively a pair of capacitors interconnected by an inductor representing the inductance of said core and serially connected across said rods and extending the effective length of the parallel wire transmission line provided by said rods and into a second extreme position wherein said core extends within said first coating only and away from said second coating to provide a parallel wire transmission line open at its ends, said loop compensating for the electrical effect of said core on said first rod in its second extreme position.

2. An oscillation generator including a series resonant circuit structure tunable over a frequency range of over two to one within the U. H. F. spectrum and comprising a first and a second rod disposed substantially parallel to each other to form a parallel wire transmission line, an amplifier having a cathode, control grid and anode, one end of each of said rods being connected respectively to said anode and control grid, an impedance element connecting said cathode to a point of substantially fixed potential, said second rod including an open loop intermediate its ends, a hollow cylindrical tube of a material having a high dielectric constant, a first and a second metallic coating provided on the outer surface of said tube and spaced from each other substantially by the distance between said rods, said first coating being electrically connected to the other end of said first rod and said second coating being electrically connected to the other end of said second rod, a metallic core slideable in said tube, and means for moving said core into a first extreme position where said core extends within both of said coatings to provide a capacitor and inductor connected serially across said rods to provide a parallel wire transmission line closed at its ends and having its length effectively extended by said core and into a second extreme position where said core extends within said first coating only and away from said second coating to provide a parallel wire transmission line open at its ends.

References Cited in the file of this patent

UNITED STATES PATENTS

| | | |
|---|---|---|
| 2,160,466 | Usselmann | May 30, 1939 |
| 2,272,851 | Ramsay | Feb. 10, 1942 |
| 2,286,428 | Mehler | June 16, 1942 |
| 2,303,388 | Pray | Dec. 1, 1942 |
| 2,440,269 | Hargrove | Apr. 27, 1948 |
| 2,453,489 | Bruntil et al. | Nov. 9, 1948 |
| 2,562,263 | Ehrlich | July 31, 1951 |
| 2,589,092 | Kihn | Mar. 11, 1952 |